US011415622B2

United States Patent
Lin

(10) Patent No.: US 11,415,622 B2
(45) Date of Patent: Aug. 16, 2022

(54) AUTOMATED TESTING MACHINE WITH DATA PROCESSING FUNCTION AND INFORMATION PROCESSING METHOD THEREOF

(71) Applicant: SPIROX CORPORATION, Hsinchu (TW)

(72) Inventor: Hsing-Fu Lin, Hsinchu (TW)

(73) Assignee: HEFEI SPIROX TECHNOLOGY CO., LTD., Hefei (CN)

(*) Notice: Subject to any disclaimer, the term of this patent is extended or adjusted under 35 U.S.C. 154(b) by 50 days.

(21) Appl. No.: 17/083,336

(22) Filed: Oct. 29, 2020

(65) Prior Publication Data

US 2022/0099729 A1 Mar. 31, 2022

(30) Foreign Application Priority Data

Sep. 28, 2020 (TW) .................................. 109133703

(51) Int. Cl.
*G01R 31/28* (2006.01)
*G01R 31/319* (2006.01)
*G01R 31/317* (2006.01)
*G01R 31/3193* (2006.01)

(52) U.S. Cl.
CPC ... *G01R 31/2834* (2013.01); *G01R 31/31726* (2013.01); *G01R 31/31905* (2013.01); *G01R 31/31917* (2013.01); *G01R 31/31935* (2013.01)

(58) Field of Classification Search
CPC .......... G01R 31/2834; G01R 31/31726; G01R 31/31905; G01R 31/31917; G01R 31/31935
See application file for complete search history.

(56) References Cited

U.S. PATENT DOCUMENTS

| | | | | |
|---|---|---|---|---|
| 2006/0247879 | A1* | 11/2006 | Hlotyak | G01R 31/319 702/108 |
| 2015/0377967 | A1* | 12/2015 | Thiruvengadam | G01R 31/31715 714/731 |
| 2020/0200819 | A1* | 6/2020 | Malisic | G01R 1/025 |
| 2021/0326242 | A1* | 10/2021 | Kramer | G06F 11/321 |

* cited by examiner

*Primary Examiner* — Christine T. Tu

(57) ABSTRACT

An automated testing machine with data processing function and an information processing method thereof are introduced. The automated testing machine includes a test head for testing more than one device under testing (DUT), and the test head further includes a test processing unit for providing more than one electrical test signal to the DUTs and conducting a processing and analyzing on more than one electrical feedback data fed back from the DUTs, so as to generate analysis result information. With the test processing unit capable of conducting data processing directly provided in the test head, signals obtained from the DUTs can be directly analyzed and processed to enable increased data processing efficiency, increased convenience in use and reduced costs of the automated test machine and the information processing method thereof.

7 Claims, 5 Drawing Sheets

AUTOMATED TESTING MACHINE WITH DATA PROCESSING FUNCTION AND INFORMATION PROCESSING METHOD THEREOF

CROSS-REFERENCE TO RELATED APPLICATION

This non-provisional application claims priority under 35 U.S.C. § 119(a) on Patent Application No(s). 109133703 filed in Taiwan, R.O.C. on Sep. 28, 2020, the entire contents of which are hereby incorporated by reference.

BACKGROUND OF THE INVENTION

1. Field of the Invention

The present disclosure relates to a testing machine, and more particular to an automated testing machine with data processing function. The present disclosure also relates to an information processing method of the automated testing machine with data processing function.

2. Description of the Related Art

Please refer to FIG. 1 that illustrates an automated test system (ATE). The ATE is used to test different devices under testing (DUTs), such as a wafer or an integrated circuit (IC). The ATE includes a base portion "A", a test head "B", a cable "C" and an externally connected computing device "D". To use the ATE, first put one DUT on the base portion "A". The test head "B" has pins provided thereon, which are in contact with the DUT in the process of testing. Any signal obtained in the testing process is transmitted via the cable "C" to the external computing device "D", at where the signal is processed to analyze results from the test.

In the conventional ATE, since the test head "B" does not have the capability of data processing, signal received during the test has to be transmitted via the cable "C" to the external computing device "D" for processing. Therefore, the conventional ATE not only has a relatively large overall volume, but also requires a lot of time in data processing to cause inconvenience in use.

BRIEF SUMMARY OF THE INVENTION

An objective of the present disclosure is to provide an automated testing machine with data processing function, on which modules capable of data processing are included in a test head thereof, so that any signal received in the course of testing can be directly processed and analyzed in real time on the automated testing machine. Since no cable is needed to connect an external computing device to the automated testing machine and data no longer needs to be transmitted to the external computing device via the cable for analyzing, data processing can be done at effectively increased efficiency and the volume and costs of the entire equipment can be reduced. Thus, the automated testing machine of the present disclosure achieves the objects of upgraded data processing efficiency, convenient in use and reduced costs. Another objective of the present disclosure is to provide an information processing method of an automated testing machine with data processing function.

To achieve at least the above objective, the automated testing machine with data processing function according to the present disclosure includes a test head for testing more than one device under testing (DUT). The test head includes a test processing unit for providing more than one electrical test signal to the DUTs and conducting a processing and analyzing on more than one electrical feedback data fed back from the DUTs, so as to generate analysis result information.

To achieve at least the above objective, an information processing method of automated testing machine is also provided. The information processing method according to the present disclosure is used to test more than one device under testing (DUT) and includes the following steps, which are executed by a test processing unit in a test head of the automated testing machine: providing more than one electrical test signal to the DUTs; receiving more than one electrical feedback data fed back from the DUTs; and conducting a data processing and analyzing on the electrical feedback data to generate analysis result information.

In conclusion, in the automated testing machine with data processing function according to the present disclosure, the test processing unit for data processing is directly provided in the test head thereof, so that signals obtained in the course of testing DUTs can be processed in real time. Since the automated testing machine is no longer needed to be connected to an external computing device via a cable and the obtained test data no longer needs to be transmitted to the external computing device via the cable for analyzing, data processing can be done at effectively increased efficiency and the volume and costs of the entire equipment can be reduced. Thus, the automated testing machine of the present disclosure achieves the objectives of upgraded data processing efficiency, convenient for use and reduced costs.

DETAILED DESCRIPTION OF THE INVENTION

To facilitate understanding of the objects, characteristics and effects of this present disclosure, embodiments together with the attached drawings for the detailed description of the present disclosure are provided. It is noted the present disclosure can be implemented or applied in other embodiments, and many changes and modifications in the described embodiments can be carried out without departing from the spirit of the disclosure, and it is also understood that the preferred embodiments are only illustrative and not intended to limit the present disclosure in any way.

Figure 1:
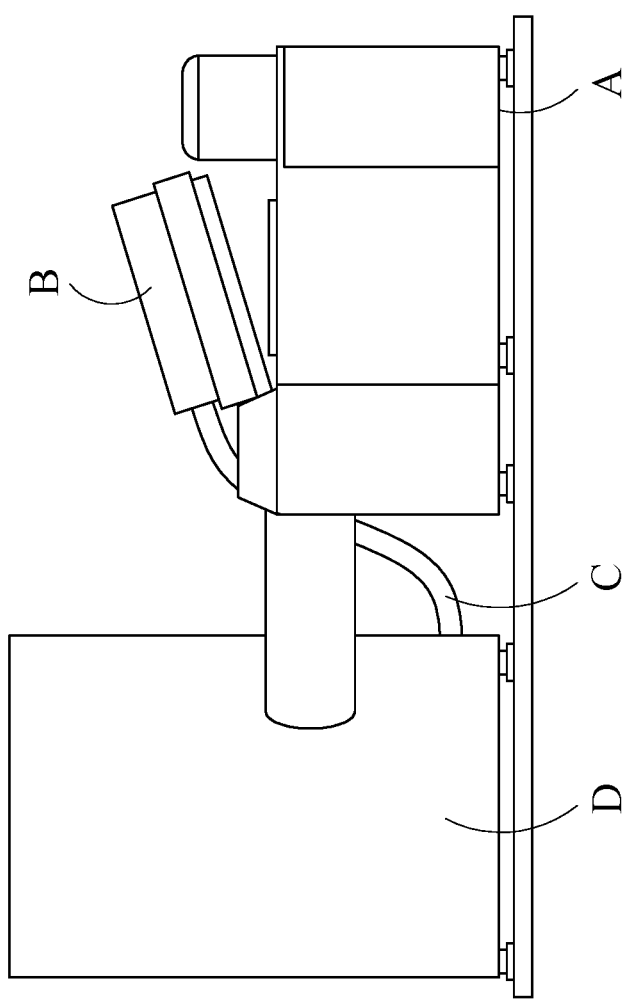
FIG. 1 is a schematic view of a conventional automated test system.
Figure 2:
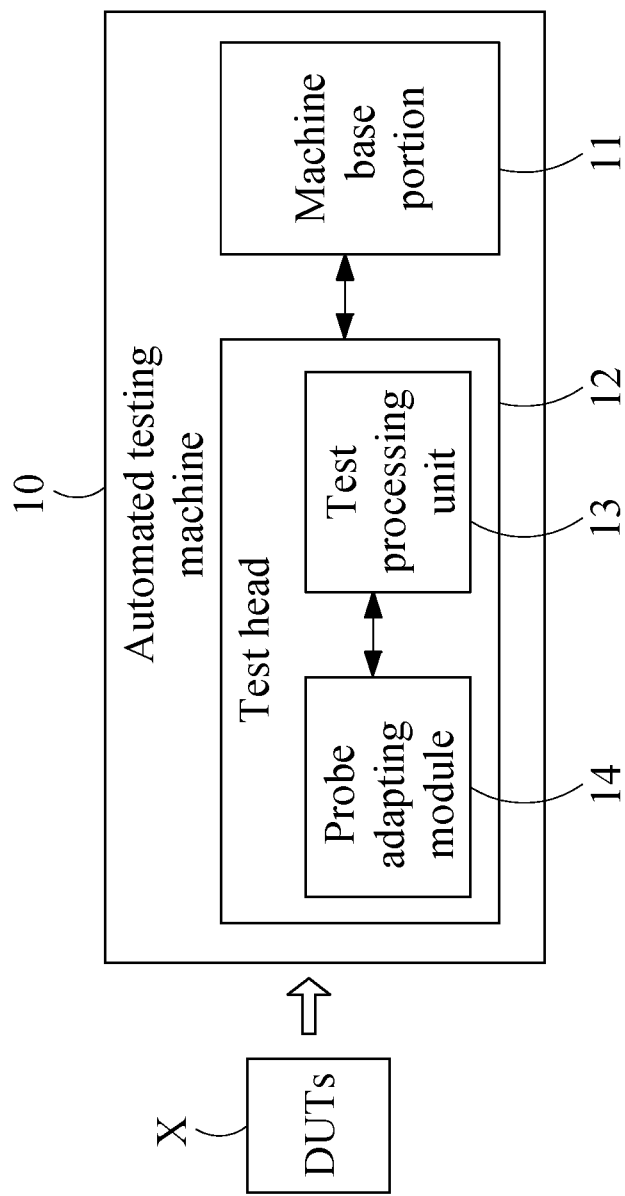
FIG. 2 is a structure diagram of an automated testing machine according to a first embodiment of the present disclosure.

Please refer to FIG. 2, which is a structure diagram of an automated testing machine with data processing function according to a first embodiment of the present disclosure, which is also briefly referred to as the automated testing machine and generally denoted by reference numeral 10 herein. As shown, the automated testing machine 10 is used to load and test more than one device under test (DUT) "X".

The automated testing machine 10 includes a machine base portion 11 and a test head 12 having a test processing unit 13 integrated thereinto. The machine base portion 11 is used to support the test head 12 and to set up, load or hold the DUTs "X" thereon. The test head 12 is used to test the DUTs "X" and to process and analyze results from the test.

In an operable embodiment, the machine base portion 11 includes an automatic DUT handling mechanical unit (not shown) provided thereon for automatically loading the DUTs "X" onto the machine base portion 11. Thereafter, the test head 12 conducts a test on the DUTs "X" and analyzes any produced signal. Finally, the DUTs "X" having been tested are unloaded into a collection container by the automatic DUT handling mechanical unit.

The test head 12 is internally provided with a circuit board (not shown), on which the test processing unit 13 is located. The test processing unit 13 has the functions of data processing and data storage, and is electrically coupled to a plurality of circuits (not shown) on the circuit board. In this way, the test processing unit 13 is integrally provided in the test head 12. The test processing unit 13 provides signals to be used in the test. The signals are transmitted by the test head 12 to the DUTs "X" for conducting different types of tests or tests for different requirements. The test processing unit 13 also receives from the test head 12 signals fed back from the DUTs "X", and conducts processing and analyzing of the received signals. The detailed configuration of the test processing unit 13 will be described herein below.

Further, to more effectively and accurately test the DUTs "X", the test head 12 includes a probe adapting module 14, which is coupled to the test processing unit 13. The probe adapting module 14 includes probe cards (not shown) for contacting with the DUTs "X", and adapting modules (not shown) for accurately mounting on, assembling to and joining with the DUTs "X". Wherein, each of the adapting modules further includes a socket, a probe interface board (PIB) and a pogo tower.

Figure 3:
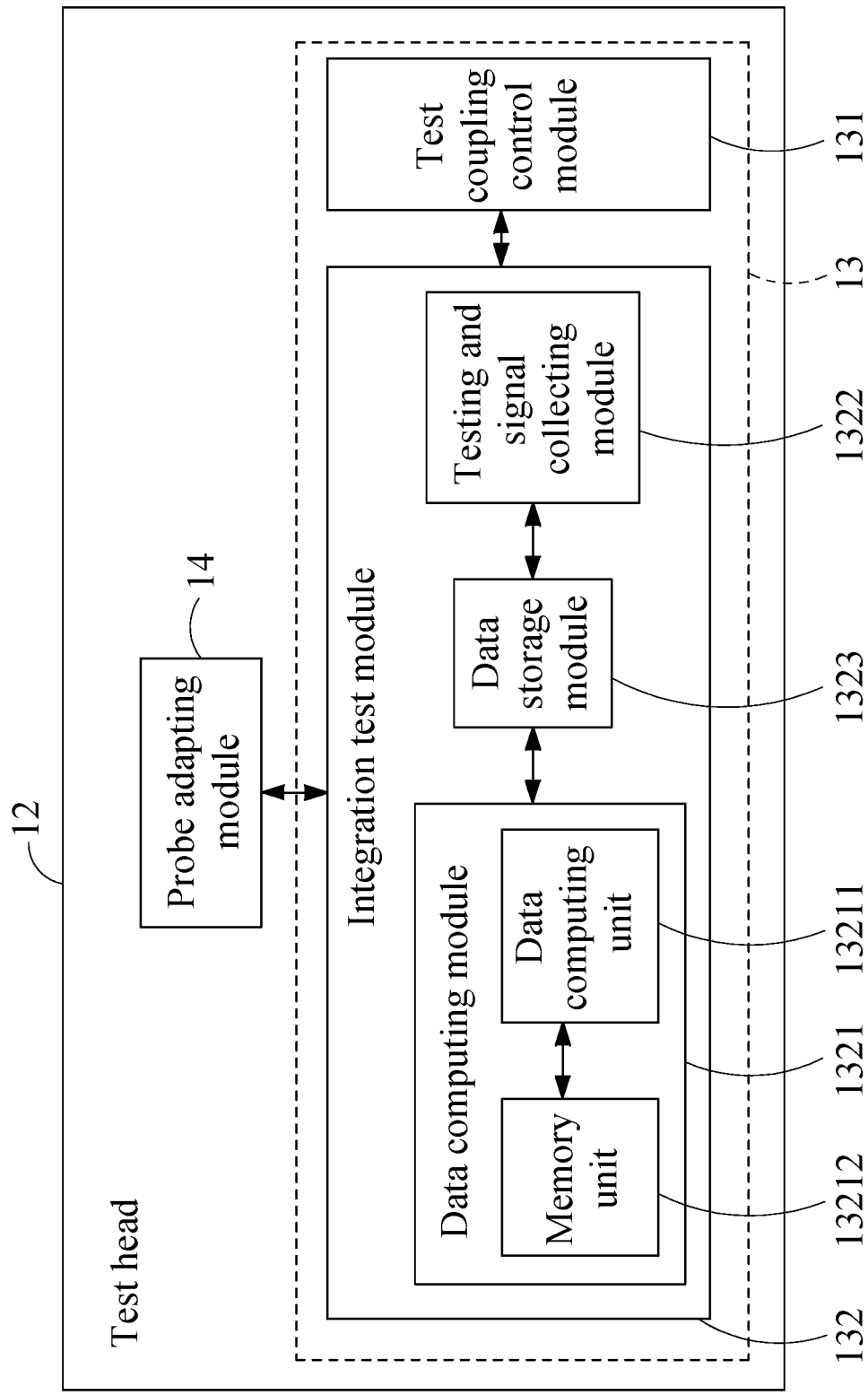
FIG. 3 is a structure diagram of a test head included in the automated testing machine shown in FIG. 2.

Please refer to FIG. 3, which is a structure diagram of the test head 12 based on the automated testing machine 10 according to the first embodiment of the present disclosure. In the first embodiment, the test processing unit 13 in the test head 12 includes a test coupling control module 131 and an integration test module 132 coupled to the test coupling control module 131.

The integration test module 132 has a plurality of instructions stored therein, and is capable of automatically executing instructions that are corresponding to a user's requirements or settings and generating more than one electrical test condition corresponding to the executed instructions; the integration test module 132 also conducts processing and analyzing of the signals received from the DUTs "X" in order to verify whether or not the DUTs "X" are qualified from the test.

Based on the electrical test conditions generated by the integration test module 132, the test coupling control module 131 automatically generates more than one corresponding electrical test signal and supplies the same to the integration test module 132.

The integration test module 132 transmits the electrical test signals to the DUTs "X" for testing the latter, and receives and stores more than one electrical feedback data fed back from the DUTs "X". The integration test module 132 conducts a data processing and analyzing on the electrical feedback data to generate and store analysis result information, which is provided for user's reference. The DUTs "X" are verified to be qualified or unqualified according to the analysis result information. Therefore, the DUTs "X" can be effectively verified whether it has passed through the test.

Further, when the DUTs "X" are verified to be qualified by the test processing unit 13 according to the analysis result information, the automatic DUT handling mechanical unit on the machine base portion 11 will unload the DUT s "X" to a collection container for storing all the qualified DUTs "X". On the other hand, when the DUTs "X" are verified to be unqualified, the automatic DUT handling mechanical unit on the machine base portion 11 will unload the unqualified DUT s "X" to another collection container for storing all the unqualified DUTs "X". In this manner, the DUTs "X" are not only automatically tested, but also automatically sorted according to the analysis test results. Therefore, the automated testing machine according to the present disclosure is more convenient for use and provides high sorting efficiency.

Wherein, the electrical test signals include a multilevel and multiphase power supply test signal, a multiple grounding design test signal, a noise protection circuit test signal, a digital switching design test signal, and a synchronous coupling control test signal.

In an operable embodiment, the integration test module 132 includes a data computing module 1321, a testing and signal collecting module 1322 and a data storage module 1323. The data computing module 1321 is coupled to the testing and signal collecting module 1322 via the data storage module 1323.

Wherein, the data computing module 1321 includes a data computing unit 13211 and a memory unit 13212. The memory unit 13212 stores the above-mentioned instructions and materials needed by the data computing unit 13211 to process data. The data computing unit 13211 reads corresponding instructions from the memory unit 13212 according to the related settings of a user on the automated testing machine 10, and executes the corresponding instructions to generate corresponding electrical test signals. The data computing module 1321 can be a central processing unit (CPU), a graphics processing unit (GPU), or a field programmable gate array (FPGA).

The testing and signal collecting module 1322 transmits the electrical test signals to the probe adapting module 14 for testing the DUTS "X". Also, the testing and signal collecting module 1322 collects, via the probe adapting module 14, the electrical feedback data fed back from the DUTS "X", and transmits the electrical feedback data to the data storage module 1323 for storing. Since the data is directly stored in the data storage module 1323 to reduce the time needed for copying and transmitting data, the automated testing machine 10 can provide upgraded data processing efficiency.

The data computing unit 13211 of the data computing module 1321 retrieves the electrical feedback data directly from the data storage module 1323 and conducts processing and analyzing on the data to generate the analysis result information and stores the same in the data storage module 1323.

Wherein, the data processing and analyzing can be a huge mathematical algorithm, a test standard algorithm, or an artificial neural analysis algorithm.

In the automated testing machine 10 according to the present disclosure, the test processing unit 13 with data processing and data storage functions is directly integrated into and located in the test head 12 to directly generate the test signals to the DUTs "X", and the electrical feedback data fed back from the DUTs "X" is stored, processed and analyzed in real time to quickly obtain the analysis result information. Since the data is no longer needed to be transmitted to an externally connected computing device via a cable for analysis, the automated testing machine 10 can provide effectively increased data processing efficiency and have reduced overall equipment volume and costs. In this way, it is able to achieve the objective of the present disclosure, including upgraded data processing efficiency, increased convenience in use, and reduced costs.

Figure 4:
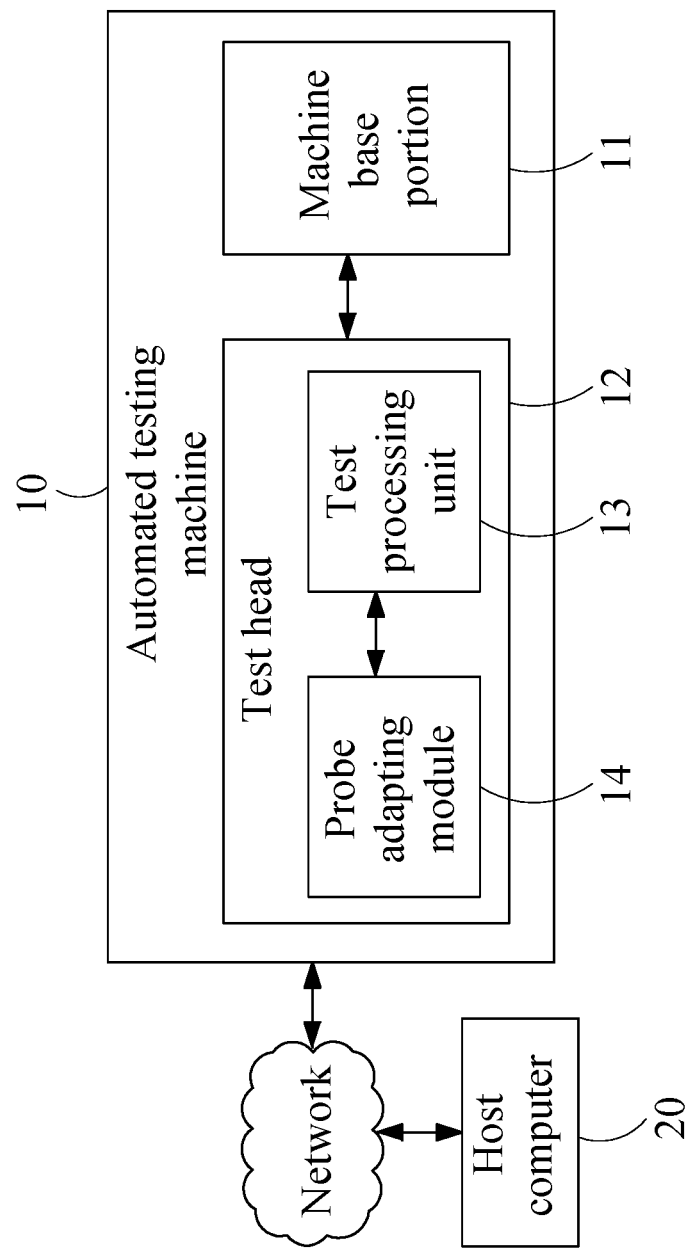
FIG. 4 is a structure diagram of the automated testing machine according to a second embodiment of the present disclosure.
Figure 5:
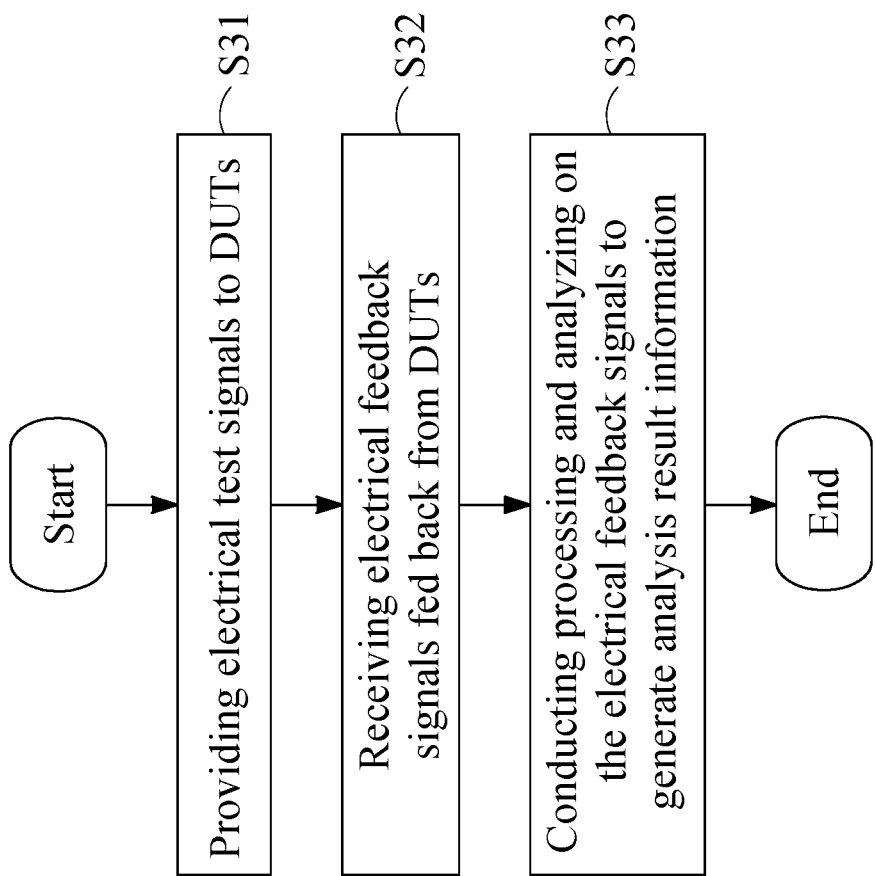
FIG. 5 is a flowchart showing steps included in an information processing method of an automated testing machine according to an embodiment of the present disclosure.

Please refer to FIG. 4, which shows a structure diagram of the automated testing machine 10 according to a second embodiment of the present disclosure. While the second embodiment is generally similar to the first one, it enables a user who is not at the site of the automated testing machine 10 to convenient retrieve required data and conduct relevant analysis thereof, so as to increase the flexibility and expandability of data processing and allow the user to remotely add, delete and adjust the instructions stored in the test processing unit 13.

As shown in FIG. 4, in the second embodiment, the automated testing machine 10 can be connected to a host computer 20 via a network. The host computer 20 can be a desk computer, a notebook computer or a tablet computer.

In the second embodiment, according to a data demand instruction received from the host computer 20, the test processing unit 13 of the automated testing machine 10 transmits the analysis result information or the electrical feedback data to the host computer 20.

Further, according to an instruction adjustment instruction received from the host computer 20, the test processing unit 13 of the automated testing machine 10 stores a newly added instruction or deletes a corresponding instruction. Wherein, when storing the newly added instruction, the test processing unit 13 may store it by saving it as a new instruction or replacing a corresponding old instruction with it.

In accordance with the above description, an information processing method of an automated testing machine with data processing function 10 can be derived for testing more than one DUT "X". The method includes the following steps, which are executed by a test processing unit 13 in a test head 12 of the automated testing machine 10:

S31: providing more than one electrical test signal to the DUTs "X";

S32: receiving more than one electrical feedback data fed back from the DUTs "X"; and S33: conducting a data processing and analyzing on the electrical feedback data to generate analysis result information.

In an embodiment, the test processing unit 13 generates corresponding electrical test signals based on more than one electrical test condition.

In an embodiment, the provided electrical test signals include a multilevel and multiphase power supply test signal, a multiple grounding design test signal, a noise protection circuit test signal, a digital switching design test signal, and a synchronous coupling control test signal.

In an embodiment, the test processing unit 13 receives and directly stores the electrical feedback data. And, the test processing unit 13 also stores the analysis result information as soon as the later is generated.

In an embodiment, the automated testing machine 10 transmits the analysis result information and the electrical feedback data to a host computer 20 for reference via a network.

While the present disclosure has been described by means of specific embodiments, numerous modifications and variations could be made thereto by those skilled in the art without departing from the scope and spirit of the present disclosure set forth in the claims.

What is claimed is:

1. An automated testing machine with data processing function, comprising a test head for testing devices under testing (DUTs); the test head including:
   a test processing unit for providing electrical test signals to the DUTs, and for conducting a data processing and analyzing on more than one electrical feedback data fed back from the DUTs to generate analysis result information, the test processing unit including:
      a test coupling control module for generating the electrical test signals based on electrical test conditions; and
      an integration test module coupled to the test coupling control module, the integration test module including:
         a testing and signal collecting module for transmitting the electrical test signals to the DUTs in order to obtain the electrical feedback data;
         a data storage module for storing data; and
         a data computing module coupled to the testing and signal collecting module via the data storage module for providing the electrical test conditions and conducting the data processing and analyzing on the electrical feedback data,
   wherein the test coupling control module generates the electrical test signals based on the electrical test conditions provided by the data computing module and supplies the electrical test signals to the integration test module;
   wherein the testing and signal collecting module transmits the electrical test signals to the DUTs and collects the electrical feedback data fed back from the DUTs, and transmits the electrical feedback data to the data storage module for storing;
   wherein the data computing module retrieves the electrical feedback data from the data storage module and conducts the data processing and analyzing on the electrical feedback data to generate the analysis result information and stores the analysis result information in the data storage module.

2. The automated testing machine according to claim 1, wherein the data computing module includes:
   a memory unit having a plurality of instructions stored therein; and
   a data computing unit for providing the electrical test conditions according to the instructions and for conducting the data processing and analyzing on the electrical feedback data.

3. The automated testing machine according to claim 2, wherein the test head further includes a probe adapting module for coupling to the test processing unit; and the probe adapting module conducting tests on the DUTs according to the electrical test signals.

4. The automated testing machine according to claim 3, wherein the electrical test signals include a multilevel and multiphase power supply test signal, a multiple grounding design test signal, a noise protection circuit test signal, a digital switching design test signal, and a synchronous coupling control test signal.

5. The automated testing machine according to claim 4, wherein the machine is connected to a host computer via a network, so as to transmit the analysis result information or the electrical feedback data to the host computer or to store a new instruction or to delete a corresponding instruction according to an instruction adjustment instruction received from the host computer.

6. An information processing method of an automated testing machine with data processing function being used to test more than one devices under testing (DUTs), comprising the following steps executed by a test processing unit in a test head of the automated testing machine:

providing electrical test signals to the DUTs;

receiving more than one electrical feedback data fed back from the DUTs; and conducting a data processing and analyzing on the electrical feedback data to generate analysis result information, wherein the test processing unit includes:

a test coupling control module for generating the electrical test signals based on the electrical test conditions; and an integration test module coupled to the test coupling control module, the integration test module including:

a testing and signal collecting module for transmitting the electrical test signals to the DUTs in order to obtain the electrical feedback data;

a data storage module for storing data; and a data computing module coupled to the testing and signal collecting module via the data storage module for providing the electrical test conditions and conducting the data processing and analyzing on the electrical feedback data, wherein the test coupling control module generates the electrical test signals based on the electrical test conditions provided by the data computing module and supplies the electrical test signals to the integration test module;

wherein the testing and signal collecting module transmits the electrical test signals to the DUTs and collects the electrical feedback data fed back from the DUTs, and transmits the electrical feedback data to the data storage module for storing;

wherein the data computing module retrieves the electrical feedback data from the data storage module and conducts the data processing and analyzing on the electrical feedback data to generate the analysis result information and stores the analysis result information in the data storage module.

7. The information processing method according to claim 6, wherein the provided electrical test signals include a multilevel and multiphase power supply test signal, a multiple grounding design test signal, a noise protection circuit test signal, a digital switching design test signal, and a synchronous coupling control test signal.

* * * * *